(12) United States Patent
Iwakami (10) Patent No.: US 8,008,655 B2
(45) Date of Patent: Aug. 30, 2011

(54) NITRIDE COMPOUND SEMICONDUCTOR DEVICE INCLUDING ORGANIC SEMICONDUCTOR LAYER UNDER GATE ELECTRODE

(75) Inventor: Shinichi Iwakami, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 406 days.

(21) Appl. No.: 12/244,046

(22) Filed: Oct. 2, 2008

(65) Prior Publication Data

US 2009/0121217 A1 May 14, 2009

(30) Foreign Application Priority Data

Nov. 8, 2007 (JP) ................................. 2007-291152

(51) Int. Cl.
*H01L 51/05* (2006.01)
(52) U.S. Cl. ........................................................ 257/40
(58) Field of Classification Search .................... 257/40, 257/E21.371, E21.387, E21.403–E21.407, 257/E21.441, E21.445, E21.448–E21.452, 257/192, 194, 285, E29.246–E29.253, 20, 257/E21.395–E21.399, E21.086, E21.097–E21.1, 257/E21.108–E21.113, E21.542, E21.543, 257/E21.697–E21.699, E29.315, 555–562, 257/E29.033, 66, 72, 223, 227, 291, 292, 257/439, 443, 655, E27.1, E27.125; 257/E27.112, E29.117, E29.003, E29.295

See application file for complete search history.

(56) References Cited

U.S. PATENT DOCUMENTS

| 2007/0187718 A1* | 8/2007 | Suzuki et al. ................. 257/194 |
| 2009/0072226 A1* | 3/2009 | Koo et al. ........................ 257/40 |
| 2009/0256142 A1* | 10/2009 | Hirai ................................ 257/40 |
| 2010/0108999 A1* | 5/2010 | Mueller et al. .................. 257/40 |
| 2010/0148154 A1* | 6/2010 | MacGillivray et al. ......... 257/40 |
| 2010/0244000 A1* | 9/2010 | Tanaka et al. ................... 257/40 |
| 2010/0283041 A1* | 11/2010 | Nakamura et al. .............. 257/40 |
| 2010/0308317 A1* | 12/2010 | Ahn et al. ........................ 257/40 |

FOREIGN PATENT DOCUMENTS

JP 2004-214471 7/2004

* cited by examiner

*Primary Examiner* — Dao H Nguyen
*Assistant Examiner* — Tram H Nguyen
(74) *Attorney, Agent, or Firm* — Oblon, Spivak, McClelland, Maier & Neustadt, L.L.P.

(57) ABSTRACT

A nitride compound semiconductor device includes a semiconductor layer including a group III nitride compound semiconductor, source and drain electrodes provided on the semiconductor layer, an insulating film provided on the semiconductor layer between the source electrode and the drain electrode, an organic semiconductor layer in contact with the semiconductor layer at an opening provided for the insulating film, and a gate electrode provided on the organic conductive layer at the opening.

14 Claims, 7 Drawing Sheets

NITRIDE COMPOUND SEMICONDUCTOR DEVICE INCLUDING ORGANIC SEMICONDUCTOR LAYER UNDER GATE ELECTRODE

CROSS REFERENCE TO RELATED APPLICATIONS AND INCORPORATION BY REFERENCE

This application is based upon and claims the benefit of priority from prior Japanese Patent Application P2007-291152 filed on Nov. 8, 2007; the entire contents of which are incorporated by reference herein.

BACKGROUND OF THE INVENTION

1. Field of the Invention

The present invention relates to a semiconductor device and more specifically relates to a nitride compound semiconductor device requiring high withstand voltage.

2. Description of the Related Art

Group III nitride compound semiconductors have high breakdown voltage. Accordingly, for example, a group III nitride compound semiconductor is applied to a high withstand voltage power device or the like as a field effect transistor (FET) including a source electrode, a drain electrode, a gate electrode, and the like arranged on a principal surface of a crystal conductor composed of a nitride compound semiconductor formed by epitaxial growth or the like. In these nitride compound semiconductor devices, distance between the electrodes, such as between the gate and drain electrodes, needs to be made longer if higher withstand voltage is required. Examples of the group III nitride compound semiconductors include aluminum nitride (AlN), gallium nitride (GaN) and indium nitride (InN). A representative group III nitride compound semiconductor is expressed by $Al_xM_yGa_{1-x-y}N$ ($0<=x<=1$, $0<=y<=1$, $0<=x+y<=1$). Herein, M is Indium (In), boron (B), or the like.

In the nitride compound semiconductor device, however, while the gate and drain electrodes are negatively biased (the FET is off), on-resistance after the negative bias is applied increases because of the current collapse phenomenon. For example, in an FET, in a state where the FET is on just after high voltage is applied, current flowing between the source and drain electrodes is reduced because of carriers, such as electrons, trapped by the crystal surface between the gate and drain electrodes.

Generally, the following countermeasures are taken to prevent the current collapse phenomenon and increase the withstand voltage:

(1) The crystal surface is coated with an oxide film, a nitride film, or the like for passivation.

(2) A field plate structure is used.

(3) The above (1) and (2) are combined.

(4) A crystal surface including little lattice defects is implemented.

For example, in a FET including gallium arsenic (GaAs), any one of the above countermeasures is employed in some cases as a countermeasure for a problem of frequency dispersion accompanied with the increase in withstand voltage. However, in an FET in which the distance between the gate and drain electrodes is increased for the purpose of increasing the withstand voltage of the device, the effect of the surface level tends to remain even if the passivation coating is employed. In the case of employing the field plate structure, the electric field is concentrated on edge part of a metallic film used as a field plate. The aforementioned countermeasures for withstand voltage then do not produce much improvement.

Especially wide gap compound semiconductor materials of gallium nitride (GaN) which are expected to have high withstand voltage include crystal defects more than silicon (Si) or GaAs, and the current collapse phenomenon thereof is more remarkable. Furthermore, a GaN compound semiconductor device having a Schottky gate structure has large gate leak current.

SUMMARY OF THE INVENTION

An aspect of the present invention is a nitride compound semiconductor device including a semiconductor layer including a group III nitride compound semiconductor; source and drain electrodes provided on the semiconductor layer; an insulating film provided on the semiconductor layer between the source electrode and the drain electrode; an organic semiconductor layer in contact with the semiconductor layer at an opening provided for the insulating film; and a gate electrode provided on the organic conductive layer at the opening.

Another aspect of the present invention is a nitride compound semiconductor device including a semiconductor layer including a group III nitride compound semiconductor; and an organic semiconductor layer between the semiconductor layer and a gate electrode.

DETAILED DESCRIPTION OF THE INVENTION

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 1:
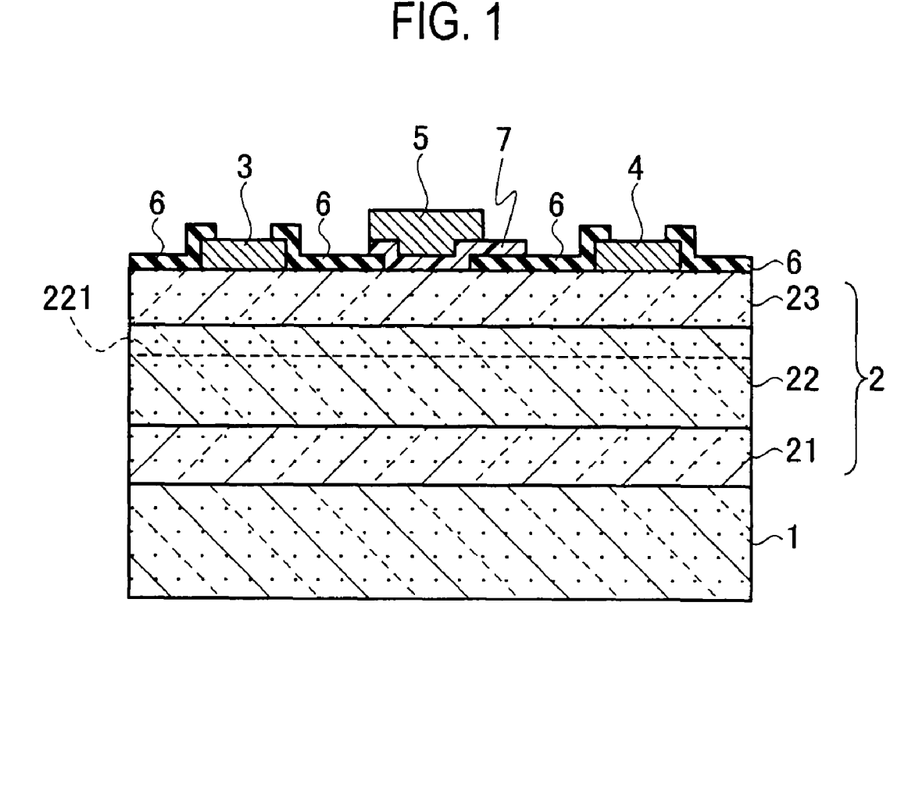
FIG. 1 is a schematic cross-sectional view showing a structure of a nitride compound semiconductor device according to a first embodiment of the present invention.

As shown in FIG. 1, a nitride compound semiconductor device according to a first embodiment of the present invention includes: a semiconductor layer 2 comprising a group III nitride compound semiconductor; source electrode 3 and the drain electrode 4 provided on the semiconductor layer 2; an insulating film 6 provided between the source electrode 3 and the drain electrode 4 on the semiconductor layer 2; an organic semiconductor layer 7 in contact with the semiconductor layer 2 at opening part provided for the insulating film 6; and a gate electrode 5 provided on the organic semiconductor layer 7 at the opening part.

As shown in FIG. 1, a source end of the organic semiconductor layer 7 is coincident with a source end of the gate electrode 5, and a drain end of the organic semiconductor layer 7 is positioned on the drain electrode 4 side of a drain end of the gate electrode 5. The "source end" is an end of the gate electrode 5 or organic semiconductor layer 7 on the source electrode 3 side. The "drain end" is an end of the gate electrode 5 or organic semiconductor layer 7 on the drain electrode 4 side.

As shown in FIG. 1, the semiconductor layer 2 is provided on the substrate 1. The substrate 1 is a sapphire substrate, a silicon carbide (SiC) substrate, a silicon substrate, or the like. For example, employment of a silicon (Si) substrate, which can be easily made to have a large diameter as the substrate 1, can reduce manufacturing cost of the nitride compound semiconductor device shown in FIG. 1.

The semiconductor layer 2 has a structure including: a buffer layer 21; a carrier travel layer 22; and a carrier supply layer 23 stacked in this order, each of which is composed of a nitride compound semiconductor. As shown in FIG. 1, the carrier travel layer 22 includes a two-dimensional electron gas layer 221 as a current channel near a heterojunction interface between the carrier travel layer 22 and carrier supply layer 23. A description is given below of a case where the carriers supplied from the carrier supply layer 23 to the carrier travel layer 22 are electrons as an example. Specifically, the two-dimensional carrier gas layer 221 is a two-dimensional electron gas layer (a 2-DEG layer), and when the nitride compound semiconductor device is turned on, electrons are supplied from the source electrode 3 to the drain electrode 4 through the 2DEG layer 221.

The buffer layer 21 is formed by a known epitaxial growth method such as metal organic chemical vapor deposition (MOCVD). The buffer layer 21 is shown as a single layer in FIG. 1 but may be composed of a plurality of layers. For example, the buffer layer 21 may be a multilayer buffer including a first sub-layer composed of aluminum nitride (AlN) and a second sub-layer composed of gallium nitride which are stacked on each other. When the nitride compound semiconductor device shown in FIG. 1 operates as a high electron mobility transistor (HEMT), the buffer layer 21 is not directly related to the operation of the HEMT and may be therefore omitted. The material of the buffer layer 21 may be a group III compound semiconductor other than AlN and GaN. The combination of the substrate 1 and buffer layer 21 may be treated as a substrate.

The carrier travel layer 22 provided on the buffer layer 21 is formed by epitaxially growing updoped GaN doped with no impurities by MOCVD or the like to a thickness of about 1 to 3 μm, for example.

The carrier supply layer 23 provided on the carrier travel layer 22 has a band gap larger than a band gap of the carrier travel layer 22 and is composed of a nitride semiconductor having a different lattice constant from that of the carrier travel layer 22. The material of the carrier supply layer 23 is expressed by $Al_xM_yGa_{1-x-y}N$ ($0<=x<=1$, $0<=y<1$, $0<=x+y<=1$, M is In, B, or the like). The component ratio x is preferably 0.2 to 0.4 and is more preferably 0.3. The carrier supply layer 23 can be composed of undoped $Al_xGa_{1-x}N$ and can be also composed of a nitride semiconductor of $Al_xGa_{1-x}N$ doped with n-type impurities.

The carrier supply layer 23 is formed on the carrier travel layer 22 by epitaxial growth such as MOCVD. Since the carrier supply layer 22 and carrier travel layer 23 have different lattice constants, piezo-polarization occurs because of lattice defects. Such piezo-polarization and spontaneous polarization provided for the crystal of the carrier supply layer 23 produce carriers with high density near the heterojunction, thus forming the 2DEG layer 221. The thickness of the carrier supply layer 23 is set so that the 2DEG layer 221 is produced by the heterojunction between the carrier travel layer 22 and the carrier supply layer 23. Specifically, the thickness of the carrier supply layer 23 is less than the carrier travel layer 22, which is, for example, about 5 to 50 nm thick and is preferably about 5 to 30 nm thick.

The carrier supply layer 23 may be made of $Al_xGa_{1-x}N$ doped with n-type impurities. In this case, a spacer layer composed of undoped AlN is provided between the carrier supply layer 23 and the carrier travel layer 22 composed of GaN, and a contact layer composed of n-type GaN is provided between the carrier supply layer 23 and the source and drain electrodes 3 and 4. The spacer layer has an effect on reducing an influence of dispersion of impurities in the carrier supply layer 23. The contact layer reduces contact resistance between the semiconductor layer 2 and the source and drain electrodes 3 and 4.

The source electrode 3 and the drain electrode 4 individually have ohmic contacts (low-resistance contacts) with the carrier supply layer 23. Each of the source electrode 3 and the drain electrode 4 can be formed as a laminate of titanium (Ti) and aluminum (Al), for example. The gate electrode 5 can be a metallic film composed of a laminate of nickel (Ni) and gold (Au), for example.

The insulating film 6 can be composed of, for example, a 200 to 500 nm thick silicon oxide ($SiO_2$) film, silicon nitride (SiN) film, or laminate structure of these films. By performing passivation coating for the surface of the semiconductor layer 2 with the insulating film 6, the surface level is lowered, and the effect of the current collapse phenomenon on the nitride compound semiconductor device can be reduced. The insulating film 6 is controlled more easily than the carrier supply layer 23, and an oxide silicon film thicker than the carrier supply layer 23 is formed as the insulating film 6 under the film formation conditions producing compression stress. The stress is then transmitted to the carrier supply layer 23, and the piezoelectric effect between the carrier supply layer 23 and carrier travel layer 22 is enhanced. Accordingly, the density of part of the 2DEG layer 221 just under the insulating film 6 is increased, and the on-resistance is reduced. It is therefore possible to reduce the current collapse phenomenon described later while keeping the low on-resistance.

The organic semiconductor layer 7 is composed of an organic material having characteristics similar to semiconductors. The organic semiconductor layer 7 is formed so as to have a mobility small enough compared to a mobility of a crystal semiconductor formed by crystal growth such as epitaxial growth. Specifically, the mobility of the p-type organic semiconductor layer 7 is set to for example $10^{-2}$ to $10 \text{ cm}^2/\text{Vs}$ and preferably set to about $5 \text{ cm}^2/\text{Vs}$. The mobility of the organic semiconductor layer 7 is therefore small enough compared to the mobility of a normal crystal semiconductor, for example, a mobility of the 2DEG layer 221 of not less than $1500 \text{ cm}^2/\text{Vs}$. The organic semiconductor layer 7 can be substantially considered as an insulating film. In other words, the nitride compound semiconductor device shown in FIG. 1 includes an MIS structure in which the gate electrode 5 is placed on the semiconductor layer 2 with the organic semiconductor layer 7 interposed therebetween.

In the example shown in FIG. 1, the organic semiconductor layer 7 is formed on the insulating film 6, and the gate electrode 5 is formed on the organic semiconductor layer 7. However, the insulating film 6 may not be formed, and the organic semiconductor layer 7 and gate electrode 5 may not be extended over the insulating film 6. In other words, to obtain the effect of the present invention, the nitride compound semiconductor device may include: the semiconductor layer 2 composed of a group III nitride compound semiconductor; the source electrode 3 and the drain electrode 4 provided on the semiconductor layer 2; the organic semiconductor layer 7 provided between the source electrode 3 and the drain electrode 4; the gate electrode provided on the organic semiconductor layer 7.

If the organic semiconductor layer 7 is formed on the insulating film 6, the concentration of impurities of the organic semiconductor layer 7 can be increased compared to the case where the organic semiconductor layer 7 is formed on the carrier supply layer 23. Accordingly, the effect of the present invention can be further enhanced.

Examples of the p-type organic semiconductor conducting holes as the carriers can be acenes composed of pentacene, tetracene, anthracene derivatives, perylene, rubrene, phthalocyanine, oligothiophene, and the like. Moreover, the p-type organic semiconductor can be metal phthalocyanine as an organic-inorganic composite metal complex including combined phthalocyanine and metal such as tin (Sn), magnesium (Mg), iron (Fe), or copper (Cu). The n-type organic semiconductor conducting electrons as the carriers can be fullerene C60 or C70, metal phthalocyanine of Cu, or the like.

The conductivity type of the organic semiconductor layer 7 is preferably a conductivity type different from a conductivity type of the semiconductor layer 2. For example, when the semiconductor layer 2 is a first conductivity type, the organic semiconductor layer 7 is configured to be a second conductivity type. Specifically, when the semiconductor layer 2 is an n-type layer including the 2DEG layer, the organic semiconductor layer 7 is configured to be p-type. By providing the p-type organic semiconductor layer 7 on the surface of the n-type semiconductor layer 2, holes are always supplied from the organic semiconductor layer 7 to the semiconductor layer 2, and electrons trapped by the surface of the semiconductor layer 2 are combined with the supplied holes to disappear.

According to the nitride compound semiconductor device of the first embodiment of the present invention, the current collapse phenomenon is reduced as described later. The current collapse phenomenon is a phenomenon that the on-resistance increases after off voltage is applied to the gate electrode 5 and then on voltage is applied to the same with high voltage being applied between the drain electrode 4 and source electrode 3. The increase in on-resistance due to the current collapse phenomenon is caused because carriers are trapped in the surface of the semiconductor layer 2 between the gate electrode 5 and drain electrode 4, especially in the vicinity of the drain end of the gate electrode 5 or the opening of the insulating film 6, and the 2DEG layer 221 is partially depleted by the trapped carriers.

In the nitride compound semiconductor device shown in FIG. 1, the carriers of the first conductivity type trapped in the surface of the semiconductor layer 2 are canceled to disappear by the carriers of the second conductivity type supplied from the organic semiconductor layer 7. Accordingly, the increase in on-resistance due to the current collapse phenomenon after application of negative bias can be reduced regardless of the properties and crystallinity of the material of the semiconductor layer 2. In the first embodiment, especially, the drain end of the organic semiconductor layer 7 is positioned on the rain electrode 4 side of the drain end of the gate electrode 5. This can reduce the electric field concentration onto the drain end of the gate electrode 5, thus properly reducing the current collapse phenomenon.

Furthermore, in the nitride compound semiconductor device shown in FIG. 1, the organic semiconductor layer 7 serving as an insulating film is placed between the gate electrode 5 and semiconductor layer 2, thus constituting an MIS structure. The gate leak current is therefore reduced.

With reference to FIGS. 2 to 5, a description is given of a method of manufacturing the nitride compound semiconductor device according to the first embodiment of the present invention below. The following method of manufacturing the nitride compound semiconductor device is just an example, and it is obvious that various manufacturing methods including modifications thereof can be carried out.

Figure 2:
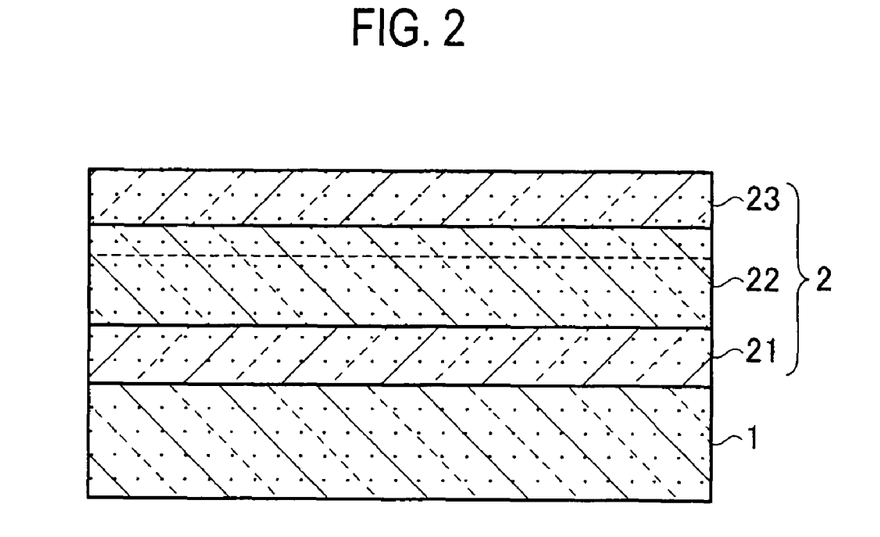
FIGS. 2 to 5 are cross-sectional process views for explaining a method of manufacturing the nitride compound semiconductor device according to the first embodiment of the present invention.

(a) As shown in FIG. 2, on the substrate 1, the buffer layer 21, carrier travel layer 22, carrier supply layer 23 are epitaxially grown and stacked in this order to form the semiconductor layer 2. The buffer layer 21 has a structure including AlN and GaN layers alternately stacked for example. The carrier travel layer 22 is a 1 to 3 µm thick updoped GaN layer, for example. The carrier supply layer 23 is composed of a nitride semiconductor having a band gap larger than a band gap of the carrier travel layer 22 and having a different lattice constant from that of the carrier travel layer 22. The carrier supply layer 23 is an undoped AlGaN layer, for example.

Figure 3:
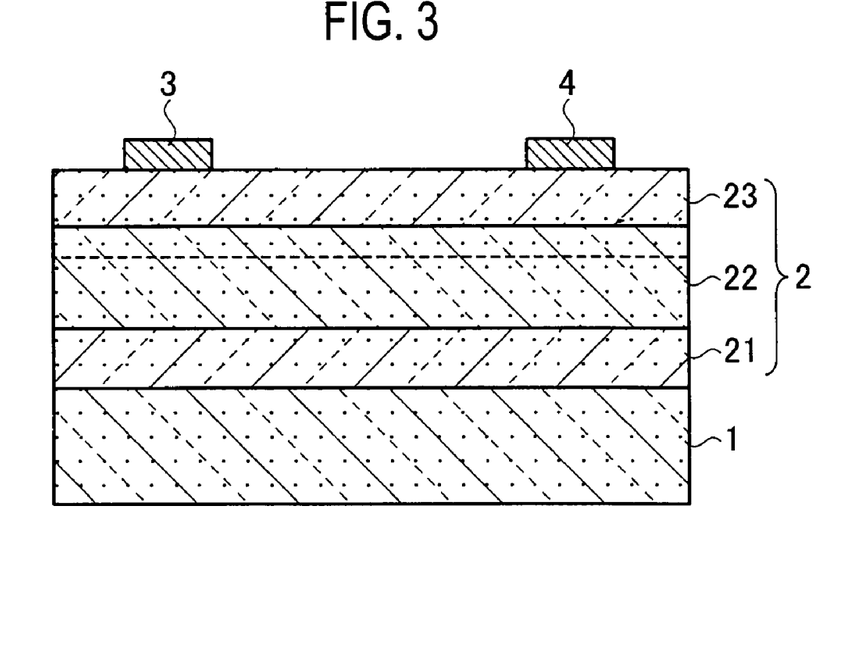

(b) On the semiconductor layer 2, a first conductor layer which serves as the source electrode 3 and the drain electrode 4 is deposited. The first conductor layer can have a laminate structure of Ti and Al, for example. Subsequently, the first conductor layer is wet-etched using a photoresist film patterned by photolithography as a mask to form the source electrode 3 and the drain electrode 4 as shown in FIG. 3. The semiconductor layer 2 is brought into ohmic contacts with the source electrode 3 and the drain electrode 4 by ohmic annealing at 500° C. for 30 min, for example.

Figure 4:
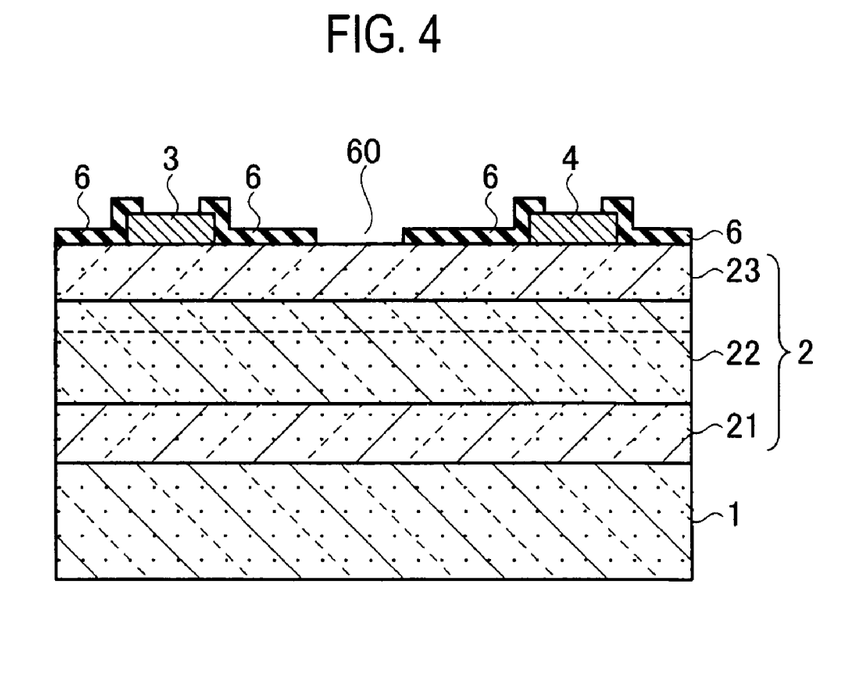

(c) On the carrier supply layer 23, the source electrode 3 and the drain electrode 4, the insulating film 6 made of an $SiO_2$ film, an SiN film, or a laminate thereof is formed to a thickness of about 200 to 500 nm by plasma chemical vapor deposition (p-CVD) or the like. Using an etching mask formed by exposure and development of a photoresist film applied on the insulating film 6 (not shown), a part of the insulating film 6 is selectively etched and removed by wet etching with hydrogen fluoride (HF) to expose a part of the surface of the semiconductor layer 2, thus forming the opening 60. The opening 60 is formed at a position where the gate electrode 5 is formed. Part of the insulating film 6 on the source electrode 3 and the drain electrode 4 is etched and removed simultaneously with the formation of the opening 60, thus exposing upper surfaces of the source electrode 3 and the drain electrode 4 as shown in FIG. 4.

Figure 5:
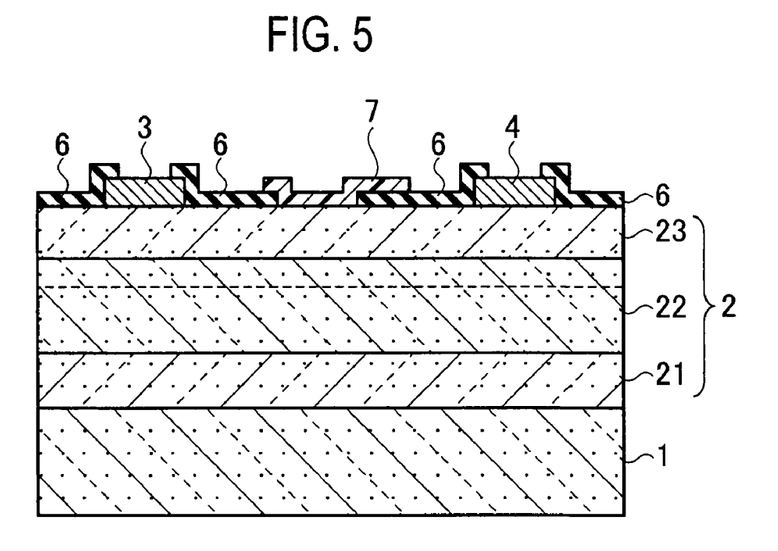

(d) The organic semiconductor layer 7 which has a thickness of about 30 nm and is made of p-type phthalocyanine or the like is formed on the insulating film 6 using resistance heating deposition so as to bury the opening 60, thus obtaining the cross-sectional structure view of FIG. 5. The method of forming the organic semiconductor layer 7 can be a sol-gel method, a spin-on method, or the like.

(e) After a new photoresist film is applied to the entire surface, a part of the photoresist film where the gate electrode 5 is formed is removed by photolithography to expose the organic semiconductor layer 7. Subsequently, on the photoresist film and organic semiconductor layer 7, a second conductor layer which serves as the gate electrode 5 is formed on the phororesist film and organic semiconductor layer 7 by sputtering. The second conductor layer can be a laminate of Ni and Au, for example. Thereafter, the gate electrode 5 is formed by lift off method using a photoresist film.

According to the aforementioned method of manufacturing the nitride compound semiconductor device of the first embodiment of the present invention, the organic semiconductor layer 7 is formed between the semiconductor layer 2 and gate electrode 5, thus providing a nitride compound semiconductor device in which the increase in gate leak current and the increase in on-resistance due to the current collapse phenomenon can be prevented.

<Modification>

FIGS. 6 to 10 show nitride compound semiconductor devices according to modifications of the first embodiment of the present invention. The nitride compound semiconductor devices shown in FIGS. 6 to 10 differ from the nitride compound semiconductor device shown in FIG. 1 in the position of the organic semiconductor layer 7. The other constitution is the same as that shown in FIG. 1.

Figure 6:
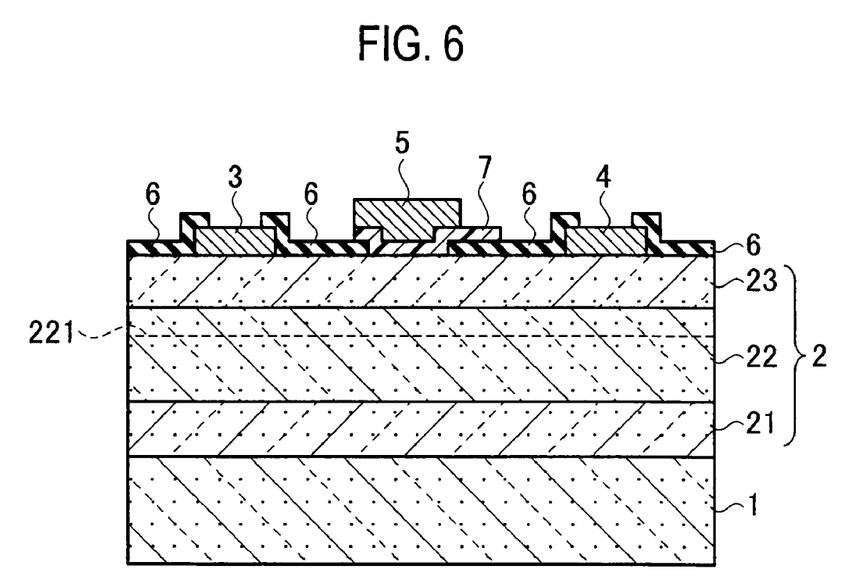
FIG. 6 is a schematic cross-sectional view showing a structure of a nitride compound semiconductor device according to a first modification of the first embodiment of the present invention.

The nitride compound semiconductor device shown in FIG. 6 is an example in which the organic semiconductor layer 7 is provided on the insulating film 6 fully provided between the gate electrode 5 and drain electrode 4 (first modification).

Figure 7:
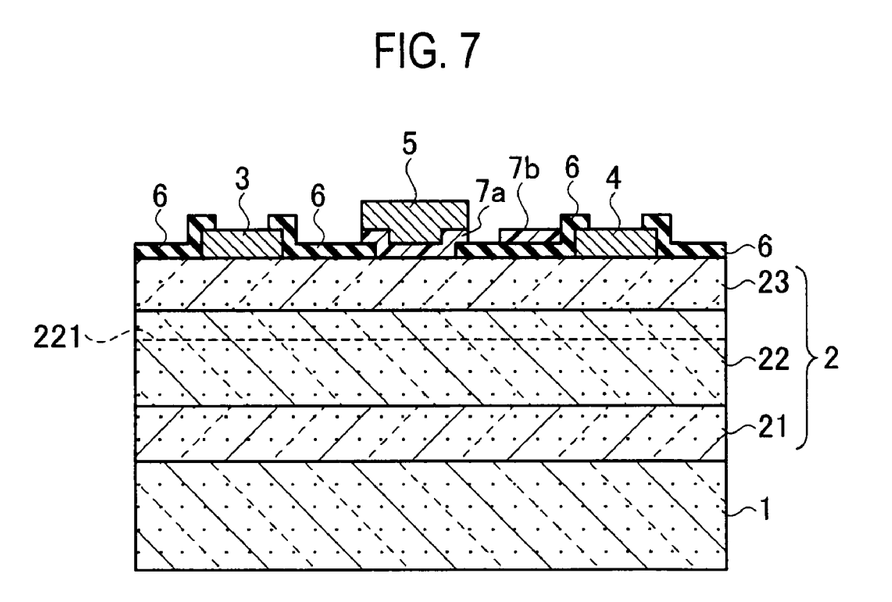
FIG. 7 is a schematic cross-sectional view showing a structure of a nitride compound semiconductor device according to a second modification of the first embodiment of the present invention.

The nitride compound semiconductor device shown in FIG. 7 is an example (second modification) in which the organic semiconductor layer 7 includes: a first organic semiconductor layer 7a provided under the gate electrode 5; and a second organic semiconductor layer 7b provided away from the first organic semiconductor layer 7a between the gate electrode 5 and drain electrode 4. The positions of the drain and source ends of the first organic semiconductor layer 7a are coincident with positions of the drain and source ends of the gate electrode 5, respectively. In the nitride compound semiconductor device shown in FIG. 7, in other words, the organic semiconductor layer 7 is not provided in the vicinity of the drain end of the gate electrode 5 on the semiconductor layer 2.

Figure 8:
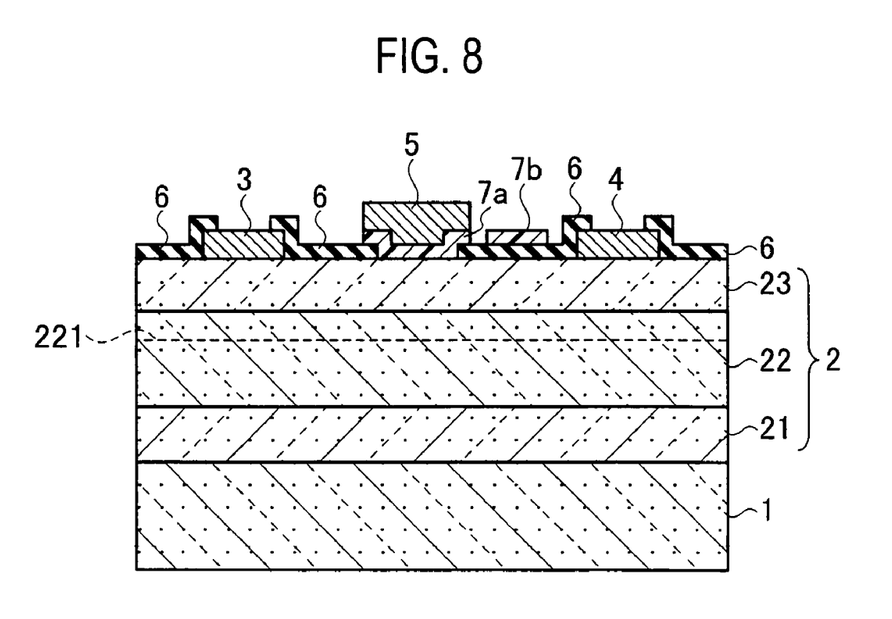
FIG. 8 is a schematic cross-sectional view showing a structure of a nitride compound semiconductor device according to a third modification of the first embodiment of the present invention.

The nitride compound semiconductor device shown in FIG. 8 is an example (third modification) in which the organic semiconductor layer 7 includes: a first organic semiconductor layer 7a whose drain and source ends agree with those of the gate electrode 5, respectively; and a second organic semiconductor layer 7b provided away from the first organic semiconductor layer 7a between the gate electrode 5 and the drain electrode 4. In the nitride compound semiconductor device shown in FIG. 8, between the gate electrode 5 and drain electrode 4 above the semiconductor layer 2, the organic semiconductor layer 7 is not provided near the drain end side of the gate electrode 5 and near the gate end side of the drain electrode 4 on the insulating film 6.

Figure 9:
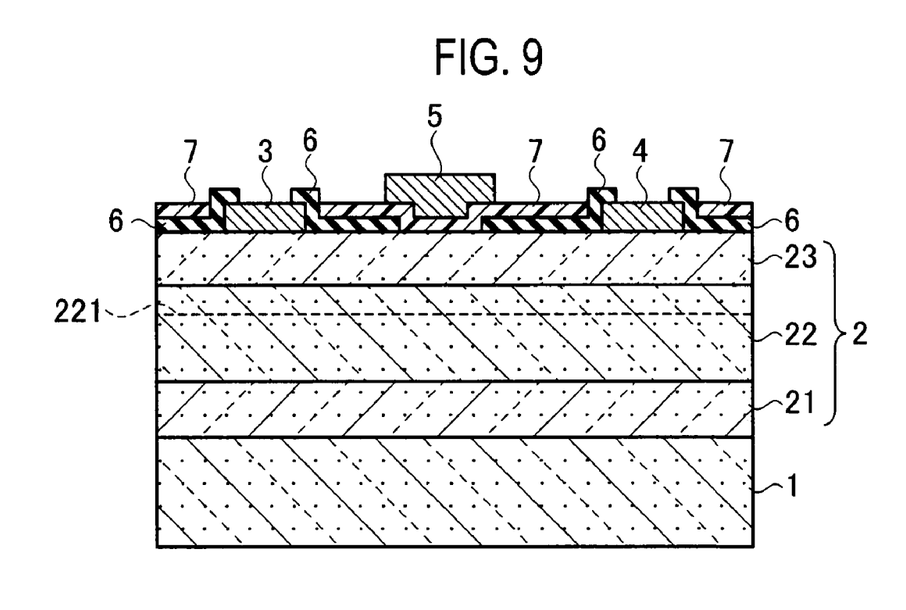
FIG. 9 is a schematic cross-sectional view showing a structure of a nitride compound semiconductor device according to a fourth modification of the first embodiment of the present invention.

The nitride compound semiconductor device shown in FIG. 9 is an example (fourth modification) in which the organic semiconductor layer 7 is fully provided on the part of the insulating film 6 between the source electrode 3 and the drain electrode 4 except the part just under the gate electrode 5.

Figure 10:
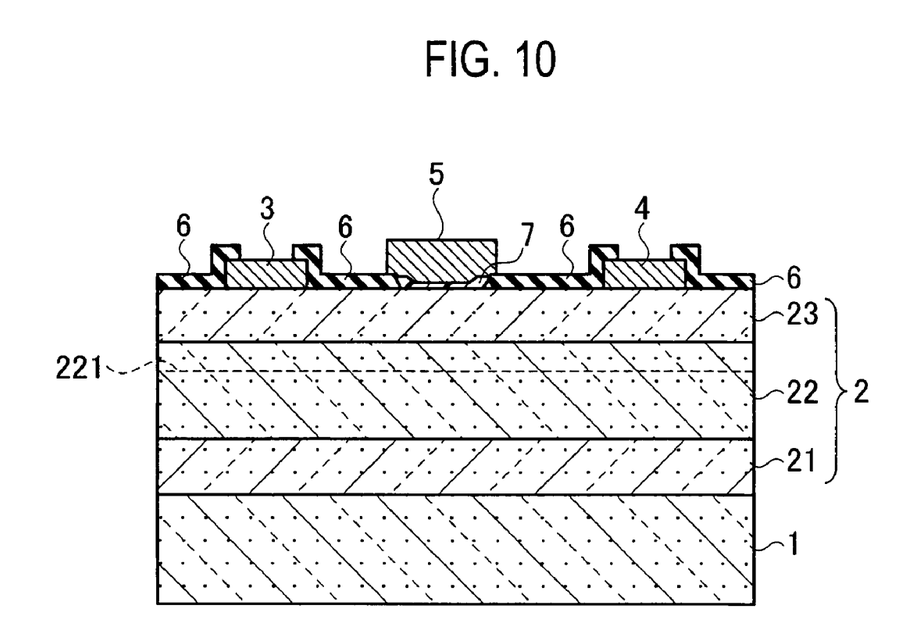
FIG. 10 is a schematic cross-sectional view showing a structure of a nitride compound semiconductor device according to a fifth modification of the first embodiment of the present invention.

The nitride compound semiconductor device shown in FIG. 10 is an example (fifth modification) in which the gate electrode 5 is provided for not only on the organic semiconductor layer 7 but also on the insulating film 6 outside of the organic conductor layer 7. In other words, the organic semiconductor layer 7 is provided for only the opening of the insulating film 6 just under the gate electrode 5.

Second Embodiment

Figure 11:
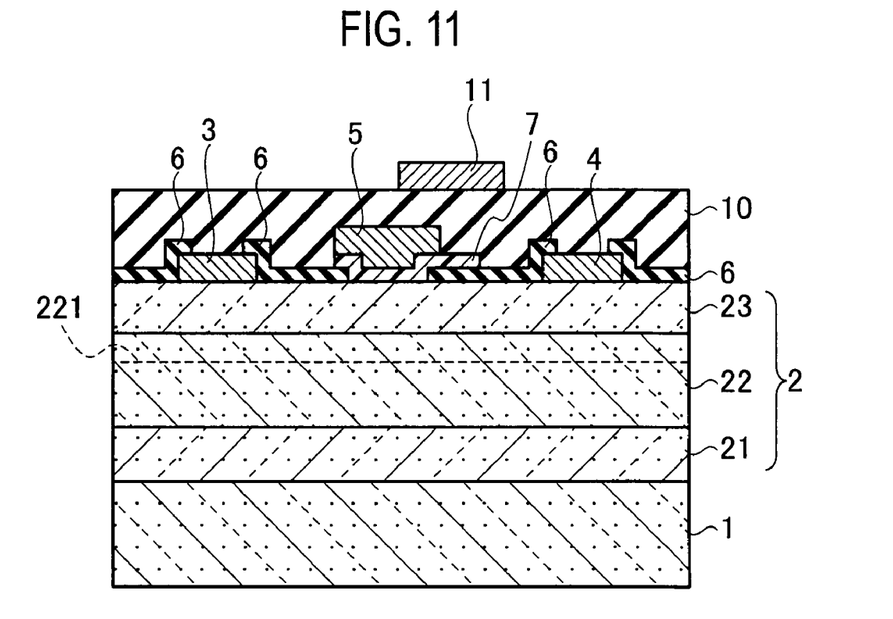
FIG. 11 is a schematic cross-sectional view showing a structure of a nitride compound semiconductor device according to a second embodiment of the present invention.

A nitride compound semiconductor device according to a second embodiment of the present invention is shown in FIG. 11. The nitride compound semiconductor device shown in FIG. 11 includes: an interlayer insulating film 10 on the insulating film 6 and organic semiconductor layer 7; and a field plate electrode 11 on a part of the interlayer insulating film 10 between the gate electrode 5 and the drain electrode 4. The field plate electrode 11 is provided over at least the drain end of the gate electrode 5. The other constitution is the same as that of the first embodiment shown in FIG. 1.

In the constitution shown in FIG. 11, by applying voltage to the field plate electrode 11, the bias electric field concentrated on the drain end of the gate electrode 5 is reduced, thus increasing the withstand voltage. Normally, the bias electric field caused by voltage applied between the source electrode 3 and the drain electrode 4 is concentrated on the drain end of the gate electrode 5. According to the nitride compound semiconductor device shown in FIG. 11, by applying voltage to the field plate electrode 11, the curvature of a depletion layer produced at the end of the gate electrode 5 can be controlled to reduce the bias electric field. The other part of the second embodiment is substantially the same as that of the first embodiment, and the redundant description is omitted.

A description is given of an example of a method of manufacturing the nitride compound semiconductor device shown in FIG. 11 below.

(a) On the nitride compound semiconductor device which is shown in FIG. 1 and formed by the manufacturing method described with reference to FIGS. 2 to 5, the interlayer insulating film 10 is formed by for example, chemical vapor deposition (CVD) or the like. The interlayer insulating film 10 is planarized by chemical mechanical polishing (CMP) or the like.

(b) A photoresist film is applied to the entire upper surface of the interlayer insulating film 10, and part of the photoresist film where the field plate electrode 11 is formed is removed by photolithography to expose the interlayer insulating film 10. Subsequently, on the photoresist film and interlayer insulating film 10, a conductor layer serving as the field plate electrode 11 is formed by sputtering or the like. The field plate electrode 11 is then formed by a liftoff process using the photoresist film.

The aforementioned method of manufacturing a nitride compound semiconductor device is just an example, and it is obvious that various manufacturing methods including this modification can be implemented.

According to the nitride compound semiconductor device of a second embodiment of the present invention, by forming the organic semiconductor layer 7 between the semiconductor layer 2 and gate electrode 5, the increase in gate leak current and the increase in on-resistance due to the current collapse phenomenon are reduced. Moreover, by providing the field plate electrode 11, the bias electric field concentrated on the end of the gate electrode 5 is reduced, thus increasing the withstand voltage.

In the nitride compound semiconductor device according to the second embodiment of the present invention, similar to the nitride compound semiconductor devices according to the modifications of the first embodiment which are shown in FIGS. 6 to 10, it is obvious that modifications in which the organic semiconductor layer 7 is provided at different positions can be employed.

Third Embodiment

Figure 12:
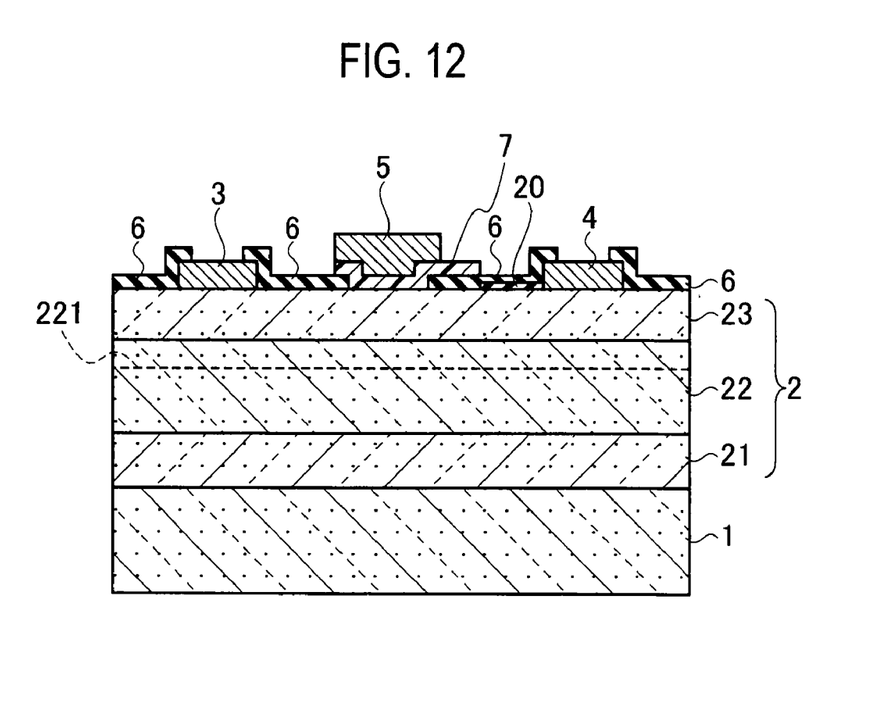
FIG. 12 is a schematic cross-sectional view showing a structure of a nitride compound semiconductor device according to a third embodiment of the present invention.

As shown in FIG. 12, a nitride compound semiconductor device according to a third embodiment of the present invention is different from that shown in FIG. 1 in that a resistive Schottky field plate (RESP) 20 is provided between the semiconductor layer 2 and insulating film 6 and between the gate electrode 5 and the drain electrode 4. The RESP 20 is provided in a Schottky contact with the principal surface of the semiconductor layer 2. The other constitution is the same as that of the first embodiment shown in FIG. 1.

In the example shown in FIG. 12, the RESP 20 is connected to the drain electrode 4 and is provided away from the gate electrode 5. The REP 20 is preferably highly resistive so as to prevent leak current and can be made of, for example, a titanium oxide, a nickel oxide, or the like which has a sheet resistance of not less than 100 MΩ/square. The RESP 20 may be composed of a plurality of stacked layers different in length and sheet resistance.

In the nitride compound semiconductor device shown in FIG. 12, if the sheet resistance of the RESP 20 is high enough to prevent leak current, the electrical potential is gradually reduced parallel to the surface in contact with the semiconductor layer 2 along the RESP 20. The electric field concentration caused between the drain electrode 4 and the gate electrode 5 can be reduced, thus increasing the withstand voltage. However, if the sheet resistance of the RESP 20 is too small to lower the potential of the end of the RESP 20 enough, leak current flows through the RESP 20, and the withstand voltage is reduced.

The RESP 20 is obtained by, for example, forming an about 5 to 20 nm thick Ti film by vacuum deposition or the like and oxidizing the Ti film by heating at about 300° C. for 5 to 30 min in air. In this case, in the REP 20, it is thought that titanium dioxide ($TiO_2$) which can be considered as a complete insulating film is changed into titanium oxide $TiO_x$ ($x<2$) containing less oxygen than $TiO_2$, or so-called oxygen poor titanium oxide.

As described above, according to the nitride compound semiconductor device of the third embodiment of the present invention, by forming the organic semiconductor layer 7 between the semiconductor layer 2 and gate electrode 5, the increase in gate leak current and the increase in on-resistance due to the current collapse phenomenon are prevented. Moreover, by providing the RESP 20, the bias electric field concentrated between the drain electrode 4 and the gate electrode 5 can be reduced, thus increasing the withstand voltage. The other constitution is substantially the same as that of the first embodiment, and redundant description thereof is omitted.

Figure 13:
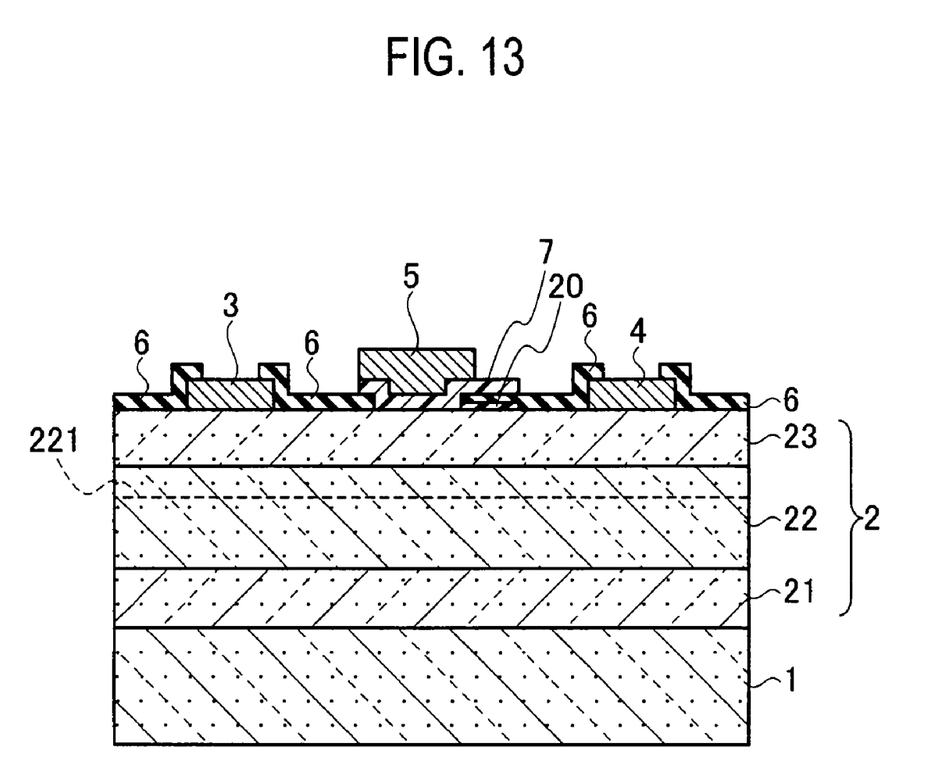
FIG. 13 is a schematic cross-sectional view showing a structure of a nitride compound semiconductor device according to a modification of the third embodiment of the present invention.

In the nitride compound semiconductor device according to the third embodiment of the present invention, it is also obvious that modifications in which the organic semiconductor layer 7 is provided at the different positions can be employed like the nitride compound semiconductor devices according to the modifications of the first embodiment which are shown in FIGS. 6 to 10. As shown in FIG. 13, The RESP 20 may be provided away from drain electrode 4 and may be in contact with the organic semiconductor layer 7 just under the gate electrode 5. The structure shown in FIG. 13 can reduce the concentration of the electric field between the drain electrode 4 and the gate electrode 5.

Other Embodiments

In the description of the above described first to third embodiments, the carrier supply layer 23 supplies electrons. However, the carrier supply layer 23 can be replaced with a hole supply layer composed of a p-type semiconductor. In this case, a two-dimensional hole gas layer as a two-dimensional carrier gas layer is produced in an area corresponding to the 2DEGlayer 221.

Each of the above described first to third embodiments shows the HEMT including the 2DEG layer 221 as an example. However, according to the present invention, the increase in gate leak current and the increase in on-resistance due to current collapse phenomenon can be suppressed in MESFETs.

Various modifications will become possible for those skilled in the art after receiving the teachings of the present disclosure without departing from the scope thereof.

What is claimed is:

1. A nitride compound semiconductor device, comprising:
   a semiconductor layer including a group III nitride compound semiconductor;
   source and drain electrodes provided on the semiconductor layer;
   an insulating film provided on the semiconductor layer between the source electrode and the drain electrode;
   an organic semiconductor layer in direct contact with the semiconductor layer at an opening provided for the insulating film; and
   a gate electrode provided on the organic semiconductor layer at the opening,
   wherein the semiconductor layer includes:
       a carrier supply layer; and
       a carrier travel layer forming a heterojunction with the carrier supply layer,
   wherein a two-dimensional carrier gas layer is formed near an interface with the carrier supply layer in the carrier travel layer.

2. The nitride compound semiconductor device of claim 1, wherein a part of the organic semiconductor layer is formed on the insulating film.

3. The nitride compound semiconductor device of claim 1, wherein a drain end of the organic semiconductor layer is extended to a drain electrode side of a drain end of the gate electrode.

4. The nitride compound semiconductor device of claim 1, wherein the organic semiconductor layer and the gate electrode are extended over the insulating film.

5. The nitride compound semiconductor device of claim 1, wherein the insulating film is a silicon oxide film.

6. The nitride compound semiconductor device of claim 1, further comprising:
   a field plate electrode provided over an area between the gate electrode and the drain electrode.

7. The nitride compound semiconductor device of claim 6, wherein the field plate electrode is provided over at least the drain end of the gate electrode in the vertical direction.

8. The nitride compound semiconductor device of claim 1, further comprising:
   a resistive Shottky field plate provided between the semiconductor layer and insulating film and between the gate electrode and the drain electrode.

9. The nitride compound semiconductor device of claim 8, wherein the resistive Schottky field plate is titanium oxide.

10. A nitride compound semiconductor device, comprising:
   a semiconductor layer including a group III nitride compound semiconductor;
      an organic semiconductor layer directly between the semiconductor layer and a gate electrode;
      source and drain electrodes provided on the semiconductor layer; and
      an insulating film provided on the semiconductor layer between the source electrode and the drain electrode, wherein the insulating film is a silicon oxide film,
      wherein the semiconductor layer includes:
         a carrier supply layer; and
         a carrier travel layer forming a heterojunction with the carrier supply layer,
      wherein a two-dimensional carrier gas layer is formed near an interface with the carrier supply layer in the carrier travel layer.

11. The nitride compound semiconductor device of claim 10, wherein a drain end of the organic semiconductor layer is extended to a drain electrode side of a drain end of the gate electrode.

12. The nitride compound semiconductor device of claim 10, further comprising:
   a field plate electrode provided over an area between the gate electrode and the drain electrode.

13. The nitride compound semiconductor device of claim 12, wherein the field plate electrode is provided over at least the drain end of the gate electrode in the vertical direction.

14. The nitride compound semiconductor device of claim 10, further comprising:
   a resistive Shottky field plate provided between the semiconductor layer and insulating film and between the gate electrode and the drain electrode.

* * * * *